United States Patent
Cutler et al.

(10) Patent No.: US 12,543,542 B2
(45) Date of Patent: Feb. 3, 2026

(54) PATTERNING METHOD USING SECONDARY RESIST SURFACE FUNCTIONALIZATION FOR MASK FORMATION

(71) Applicant: Tokyo Electron Limited, Tokyo (JP)

(72) Inventors: Charlotte Cutler, Albany, NY (US); David Conklin, Saratoga Springs, NY (US)

(73) Assignee: Tokyo Electron Limited, Tokyo (JP)

(*) Notice: Subject to any disclaimer, the term of this patent is extended or adjusted under 35 U.S.C. 154(b) by 238 days.

(21) Appl. No.: 18/150,099

(22) Filed: Jan. 4, 2023

(65) Prior Publication Data

US 2024/0030029 A1    Jan. 25, 2024

Related U.S. Application Data

(60) Provisional application No. 63/390,415, filed on Jul. 19, 2022.

(51) Int. Cl.

| | | |
|---|---|---|
| *H01L 21/027* | (2006.01) | |
| *G03F 7/039* | (2006.01) | |
| *H01L 21/02* | (2006.01) | |
| *H01L 21/033* | (2006.01) | |
| *H01L 21/3065* | (2006.01) | |
| *H01L 21/311* | (2006.01) | |

(52) U.S. Cl.
CPC ...... *H01L 21/0274* (2013.01); *H01L 21/0273* (2013.01); *H01L 21/0332* (2013.01); *H01L 21/3065* (2013.01); *H01L 21/31144* (2013.01); *G03F 7/0392* (2013.01); *H01L 21/0226* (2013.01); *H01L 21/0337* (2013.01)

(58) Field of Classification Search
None
See application file for complete search history.

(56) References Cited

U.S. PATENT DOCUMENTS

| | | | |
|---|---|---|---|
| 2010/0003622 A1* | 1/2010 | Matsumaru | G03F 7/0397 |
| | | | 106/287.11 |
| 2014/0263172 A1* | 9/2014 | Xie | H01L 21/68707 |
| | | | 216/41 |

FOREIGN PATENT DOCUMENTS

| | | | | |
|---|---|---|---|---|
| WO | WO-2019217749 A1 * | 11/2019 | | G03F 7/004 |

OTHER PUBLICATIONS

Luo, Chaoyun et al. "Review of recent advances in inorganic photoresists," RSC Advances, Royal Society of Chemistry, Feb. 5, 2020, 11 pages.

(Continued)

*Primary Examiner* — Joshua L Allen
*Assistant Examiner* — Andrew Keelan Laobak
(74) *Attorney, Agent, or Firm* — Slater Matsil LLP

(57) ABSTRACT

A method of patterning a substrate includes exposing a photoresist layer on the substrate with a pattern of actinic radiation to form a chemically reactive surface pattern, and coating, at the track system, a spin-on-material to convert the chemically reactive surface pattern to a photoresist surface mask pattern. The method further includes etching the photoresist layer using the photoresist surface mask pattern as a first etch mask to form a photoresist mask pattern, and etching a layer to be etched with the photoresist mask pattern as a second etch mask.

20 Claims, 8 Drawing Sheets

(56) References Cited

OTHER PUBLICATIONS

Manouras, Theodore, "High Sensitivity Resists for EUV Lithography: A Review of Material Design Strategies and Performance Results," Nanomaterials, Aug. 12, 2020, 24 pages.
Nye, Rachel A. et al., "Compatibility between polymethacrylate-based extreme ultraviolet resists and TiO2 area-selective deposition," Journals of Micro. Micro/Nanopattern. Mater. Metrol., Oct.-Dec. 2022, vol. 21(4), 14 pages.
Shirai, Masamitsu et al., "Plasma Developable Photoresists Based on Surface Modification," Materials Research Society of Japan. Nov. 1990, vol. 13-B_74, 10 pages.
Sinha, Ashwini et al., "A Novel Top Surface Imaging Approach Utilizing Direct-Area Selective Atomic Layer Deposition of Hard Masks," Proceedings of SPIE 6519, Advances in Resist Materials and Processing Technology XXIV, 65191J (Mar. 31, 2007), 11 pages.
Chuang, Ya-Mi et al., "Using Directed Self Assembly of Block Copolymer Nanostructures to Modulate Nanoscale Surface Roughness: Towards a Novel Lithographic Process," Advanced Functional Materials, Adv. Funct. Mater. 2012, DOI: 10.1002/adfm. 201200564, Jan. 14, 2013, 11 pages.
Henderson, et al., "Top-surface imaging resists for EUV lithography," Proceedings of SPIE, Emerging Lithographic Technologies II, (Jun. 5, 1998); doi: 10.1117 /12.309590, Event: 23rd Annual International Symposium on Microlithography, 1998, Santa Clara, CA, United States, 10 pages.
Hill, D.J., et al., "Radiation Chemistry of Polymers," Encyclopedia of Polymer Science and Technology, DOI: 10.1002/0471440264. pst488.pub2, Jul. 15, 2002, 58 pages.
Krysak, Marie et al., "Extending resolution limits of EUV resist materials." Extreme Ultraviolet (EUV) Lithography VI, Proc. of SPIE vol. 9422, 942205, doi: 10.1117/12.2086276, Proc. of SPIE vol. 9422 942205-1, Mar. 19, 2015, 8 pages.
Sinha, Ashwini et al., "A Top Surface Imaging Method Using Area Selective ALD on Chemically Amplified Polymer Photoresist Films," Electrochemical and Solid-State Letters, 9 (11) G330-G333, Apr. 28, 2006, 4 pages.

\* cited by examiner

… (1)

PATTERNING METHOD USING SECONDARY RESIST SURFACE FUNCTIONALIZATION FOR MASK FORMATION

CROSS-REFERENCE TO RELATED APPLICATIONS

This application claims the benefit of U.S. Provisional Application No. 63/390,415 filed on Jul. 19, 2022, which application is hereby incorporated herein by reference.

TECHNICAL FIELD

This invention relates to microfabrication including microfabrication of integrated circuits as well as processes involved in patterning semiconductor substrates.

BACKGROUND

In material processing methodologies (such as photolithography), creating patterned layers typically involves the application of a thin layer of actinic radiation-sensitive material, such as photoresist, to an upper surface of a substrate. This radiation-sensitive material is transformed into a patterned mask that can be used to etch or transfer a pattern into an underlying layer on a substrate. Patterning of the radiation-sensitive material generally involves exposure by a radiation source through a reticle (and associated optics) onto the radiation-sensitive material using, for example, a photolithography system. This exposure creates a latent pattern within the radiation-sensitive material which can then be developed. Developing refers to dissolving and removing a portion of the radiation-sensitive material to yield a topographic or relief pattern. For example, developing can include removal of irradiated regions of the radiation-sensitive material (as in the case of positive photoresist), or non-irradiated regions (as in the case of negative resist) using a developing solvent or a developing etchant gas. The relief pattern can then function as a mask layer.

SUMMARY

A method of patterning a substrate includes receiving, at a track system, a substrate including a photoresist layer over a layer to be etched, the photoresist layer being sensitive to actinic radiation; exposing the photoresist layer with a pattern of the actinic radiation to form a chemically reactive surface pattern on portions of the photoresist layer exposed to the actinic radiation, deeper portions of the photoresist layer between the chemically reactive surface pattern and the layer to be etched remaining unexposed to the actinic radiation after the exposing; coating, at the track system, a spin-on-material to convert the chemically reactive surface pattern to a photoresist surface mask pattern, the chemically reactive surface pattern interacting with a masking chemical during the converting; removing, at the track system, portions of the spin-on-material that are not converted to the photoresist surface mask pattern; etching the photoresist layer using the photoresist surface mask pattern as a first etch mask to form a photoresist mask pattern; and etching the layer to be etched with the photoresist mask pattern as a second etch mask.

A method of patterning a substrate includes receiving a substrate including a photoresist layer spin coated over a layer to be etched, a major surface of the photoresist layer including a chemically reactive surface pattern on first portions of the photoresist layer exposed to extreme ultraviolet radiation, second portions of the photoresist layer, disposed between the chemically reactive surface pattern and the layer to be etched, being unexposed to the extreme ultraviolet radiation; spin coating a mask precursor solution including a masking chemical and a solvent over the photoresist layer to form a mask precursor solution layer; forming, based on a chemical reaction between the mask precursor solution layer and the chemically reactive surface pattern, a photoresist surface mask pattern; removing unreacted mask precursor solution; patterning the photoresist layer using the photoresist surface mask pattern as a first etch mask to form a patterned photoresist layer; and etching the layer to be etched with the patterned photoresist layer as a second etch mask.

A method of patterning a substrate includes receiving a substrate including a photoresist layer disposed over a layer to be etched and an intermediary layer disposed between the photoresist layer and the layer to be etched; exposing the photoresist layer with a pattern of the actinic radiation to form a chemically reactive surface pattern on portions of the photoresist layer exposed to the actinic radiation; converting the chemically reactive surface pattern to form a photoresist surface mask pattern; etching the intermediary layer using the photoresist surface mask pattern as a first etch mask to form an intermediary layer pattern; and etching the layer to be etched with the intermediary layer pattern as a second etch mask.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

Figure 1:
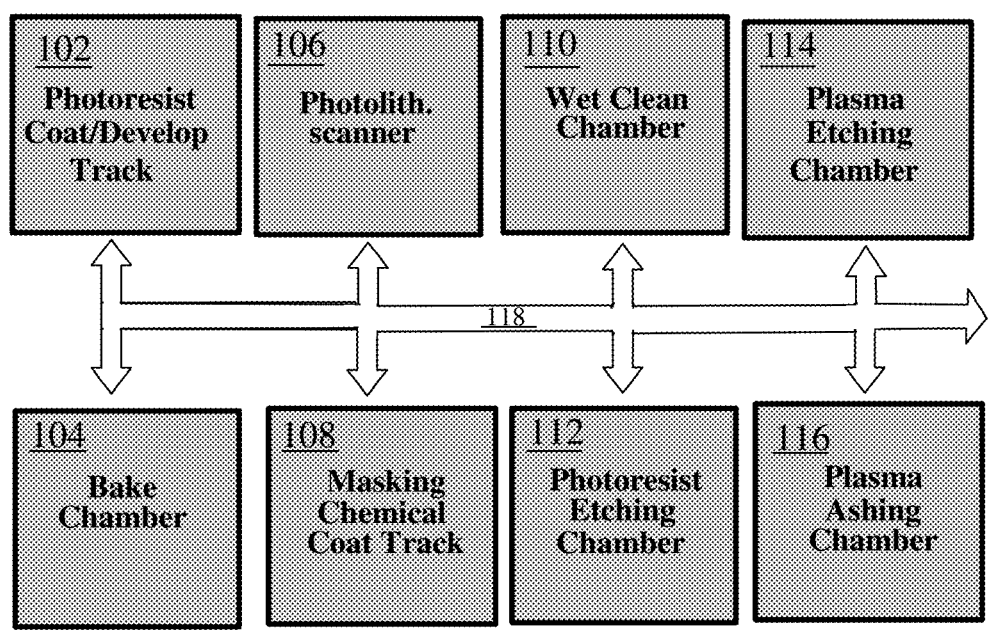
FIG. 1 is a block diagram of a semiconductor apparatus for forming patterns on substrates in accordance with embodiments.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

Current leading resist candidates for high numerical aperture (NA) extreme ultraviolet (EUV) photolithography are metal oxide-based resists, where cluster formation and network crosslinking produce a change in either solubility or etch resistance. Photo speed (sensitivity), LWR (line width roughness), resolution and defects are still a major challenge. A surface imaging, tone reversal approach herein enables use of conventional chemically amplified (CAR) EUV resists. Such techniques herein are an alternative to metal oxide resists for high NA EUV, enabling the ability to break the resolution/line edge roughness/sensitivity (RLS) triangle by providing a unique approach to pattern formation for semiconductor manufacturing.

Techniques described herein only need surface imaging of an EUV resist or other resists, that is, that a given pattern of actinic radiation does not need to fully expose a given resist layer thickness. Surface imaging requires fewer EUV photons (therefore less dose and faster scanning time) than imaging through the entire photoresist layer thickness. Note that techniques herein can be used with other resists such as longer wavelength resists, UV resists, DUV resists, EUV resists, and e-beam resists. There is typically more benefit when using techniques described herein to prevent pattern collapse at very small dimensions, such as less than about 40 nm and even less than about ten nanometers. A surface latent image of chemically active groups is formed in regions where the photoresist is exposed with actinic radiation. The surface latent image can then be used as a selective deposition template for hardmask chemicals, polymerization, or other masking material with a different etch selectivity as compared to the photoresist.

Techniques described herein thus provide a method that creates relief patterns from photoresist layers using anisotropic dry etch to remove patterned material. Embodiments herein provide a dry etch develop solution that can be implemented with conventional chemically amplified (CAR) photoresists. Embodiments use polarity changes at the top surface of a layer of photoresist to provide chemical selectivity differentiation between the exposed and unexposed regions. The polarity differentiation on the surface mitigates the need for the full depth of a photoresist to be exposed and mitigates the need for wet developing. A hardmask precursor solution with masking chemicals can be deposited on the surface latent image of chemically active groups. The masking chemicals can react with the chemically active groups to form a hardmask on the exposed surfaces of the photoresist. Alternatively, masking chemicals can be vapor-deposited on the surface of the photoresist and reacted with the chemically active groups to form a hardmask. Gaseous masking chemicals can react with the chemically active groups to selectively form a hard mask over these exposed photoresist regions. The masking chemicals can react with the polarity of the chemically active groups electrostatically or can chemically react to form covalent bonds. An anisotropic dry etch step may then be executed to remove uncovered portions of the layer of photoresist, while the regions covered by hardmask material are protected and remain intact.

As can be appreciated, there are several benefits that embodiment techniques herein provide. Only a top surface of the photoresist layer, which may be many times thinner than the spun-on resist layer, is imaged. This significantly reduces the actinic depth of focus and exposure dose requirements. Embodiment techniques can use conventional CAR (organic) resists. Contrast and resolution of conventional resists may be improved with embodiment techniques. Masking chemicals can react with small numbers of —COOH or —OH reactive groups and still modify the full edge (increasing image gradient) to make patterns better than the original aerial image. Dry development etching reduces the danger of pattern collapse when thick photoresist layers are used. Enhanced LWR is provided through the use of selected surface polymers or dry etch conditions. Because only the surface of the photoresist is imaged, transparency to the actinic radiation is not required. Embodiment patterning methods using secondary resist surface functionalization for mask formation may be performed in integrated patterning systems.

Figure 2:
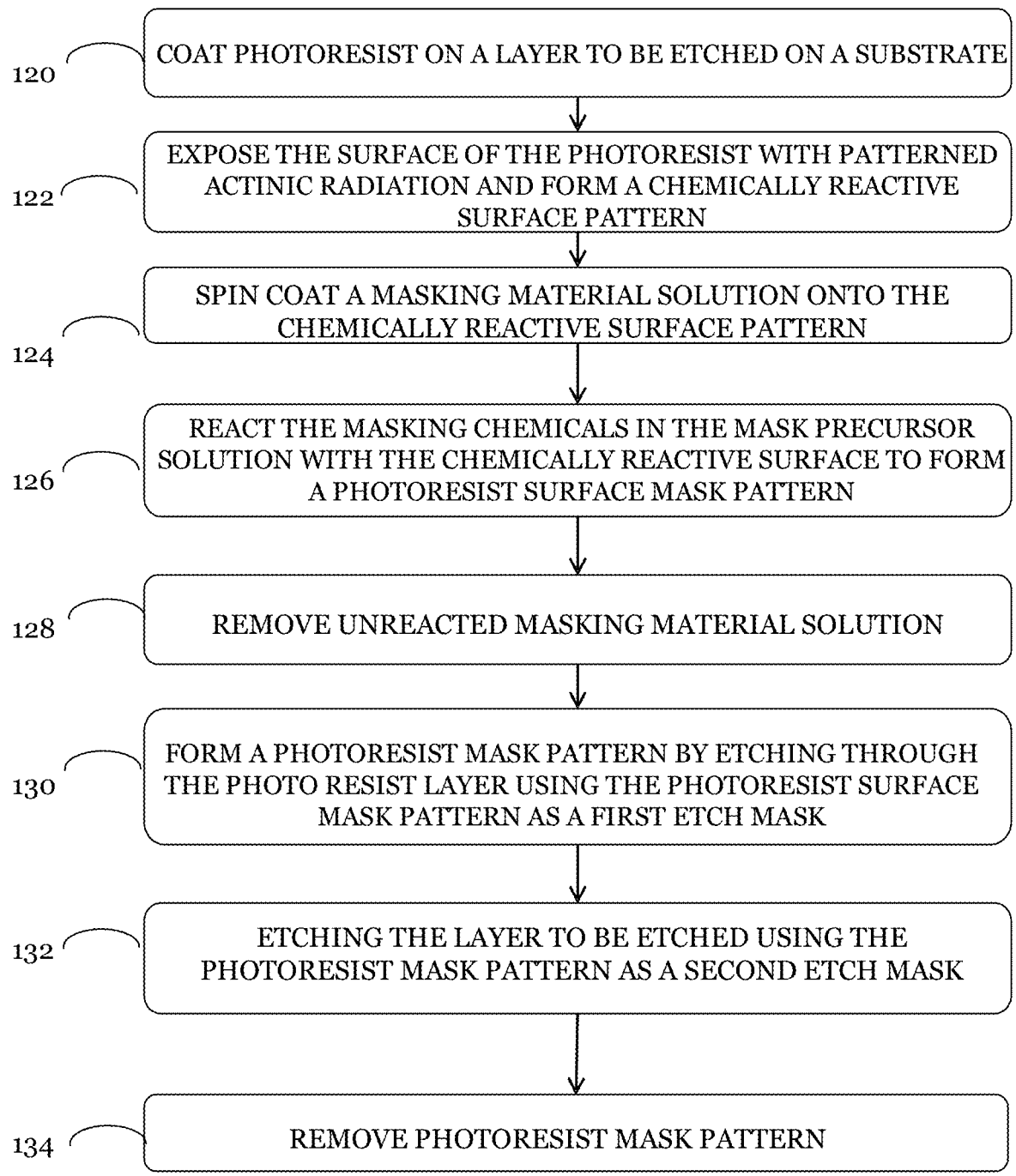
FIG. 2 is a flow diagram with blocks describing a patterning method using secondary resist surface functionalization for mask formation in accordance with embodiments.

An example embodiment will now be described with reference to FIG. 1, FIG. 2, and FIGS. 3A-3G. FIG. 1 is a block diagram of a patterning system 100. FIG. 2 is a flow diagram with the major steps in forming a pattern according to embodiments. FIGS. 3A-3G are three-dimensional isometric projection views illustrating process steps in the FIG. 2 flow diagram.

FIG. 1 is a block diagram of a patterning system 100 showing various manufacturing tools coupled together with a wafer transport system 118. The patterning system 100 in FIG. 1 includes a photoresist coat/develop track for spin-coating photoresist layers, a bake chamber 104 for driving off solvents from spin-coated layers or for initiating thermally activated chemical reactions, a photolithography scanner 106 for exposing the photoresist with patterns of actinic radiation, a masking chemical coating track 108 for forming a masking material layer on an exposed photoresist layer, a wet clean chamber 110 for removing unreacted masking chemicals, a photoresist etching chamber for etching hardmask patterns through the photoresist layer, a plasma etching chamber 114 for etching the pattern through a layer to be etched, and a plasma ash chamber 116 for removing organic layers such as photoresist. Some of the tools may be integrated into a track system or may be standalone tools coupled to the track by the wafer transport system 118. In a track system, a plurality of wafers may be sequentially processed. The track system may include one or more of the above chambers so that sequential processes may be carried out on the wafer automatically. In a track system, the wafer is supported on the track while being processed within each chamber and being transported by the wafer transport system 118. The track system may run through all processing chambers that are not within vacuum. For example, bake chamber 104 may be a standalone bake chamber or may be a hot plate integrated into the photoresist coat/develop track 102. The photolithography scanner 106 can be a scanner such as a deep ultraviolet scanner (DUV) with 248 nm or 193 nm radiation, an extreme ultraviolet scanner (EUV) with 13.5 nm radiation, or an e-beam radiation tool.

Figure 3A:
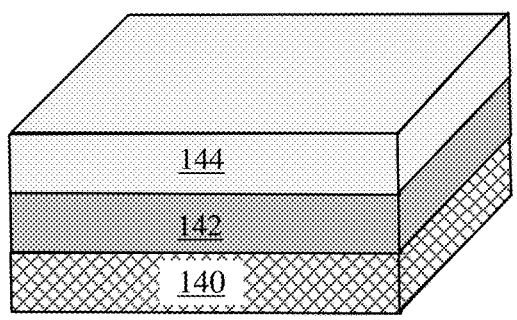
FIGS. 3A-3G are three-dimensional isometric projection views of process steps for forming patterns on substrates in accordance with embodiments.

Referring to block 120 in FIG. 2, and FIG. 3A, a photoresist layer 144 is deposited on a layer to be etched 142 overlying a semiconductor substrate 140 using photoresist coat/develop track 102 in FIG. 1. The photoresist layer 144 in this illustrative embodiment can be a EUV photoresist such as chemically amplified EUV photoresist (CAR).

In general, "substrate" as used herein generically refers to an object being processed. The substrate 140 may include any material portion of structure of a device, particularly a semiconductor or other electronics device, and may, for example, be a base substrate structure, such as a semiconductor wafer, a lithographic reticle, or a layer on or overlying a base substrate structure such as a dielectric thin film, a metallic thin film, or an electronic device. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Figure 3D:
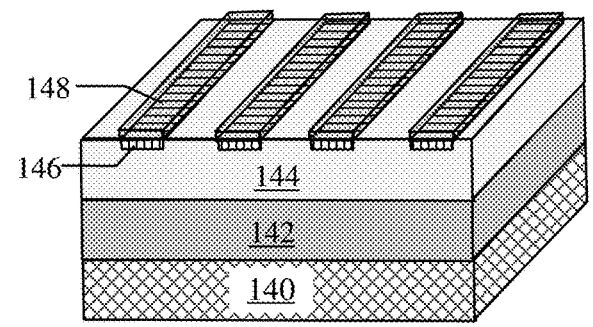
Figure 3B:
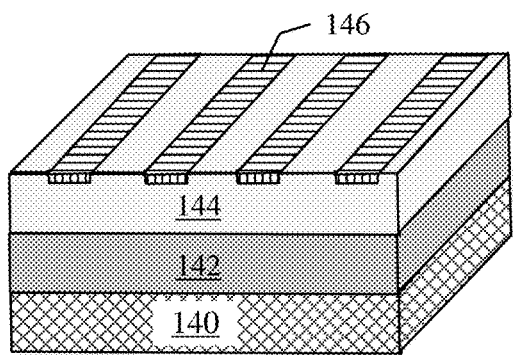

In block 122 in FIG. 2 along with FIG. 3B, the surface of the photoresist layer 144 is exposed in a photolithography scanner 106 (FIG. 1) with actinic radiation projected through a photomask. When using a conventional CAR photoresist, this can result in, for example, changes to the resist surface including formation of chemically active groups such as carboxyl groups (—COOH), hydroxyl groups (—OH) or other polarity or chemical changes based on materials used in the photoresist. For example, other photoresist formulations can result in acetyl groups, sulfonate groups, ether groups, hydroxyl groups, ester groups, aldehyde groups, carboxyl groups, amine groups, or amide groups on the surface of the photoresist layer. FIG. 3B illustrates the formation of a chemically reactive surface pattern 146 where the photoresist layer 144 is exposed to the actinic radiation.

Forming the chemically reactive surface pattern 146 on the surface of the photoresist instead of exposing the pattern completely through the photoresist layer 144 offers a number of significant advantages. Advantageously, the dose of actinic radiation required to form the chemically reactive surface pattern 146 is lower than the dose required to expose the pattern throughout the entire thickness of the photoresist layer 144. For example, this lower dose may enable a corresponding increase in the number of wafers that can be printed each hour in the EUV photolithography tool thus reducing cost. In addition, advantageously, since the chemically reactive surface pattern 146 is formed only on the surface of the photoresist layer 144, the depth of focus requirements for the photolithography scanner 106 are significantly relaxed. Since the chemically reactive surface pattern 146 is formed only on the surface of the photoresist layer 144, the photoresist layer 144 need not be transparent to the actinic radiation as is required when the pattern is exposed through the entirety of the photoresist layer 144. After exposure a post exposure bake may be performed to drive off excess solvent and to enhance chemical reactions in the chemically amplified resist.

Figure 3E:
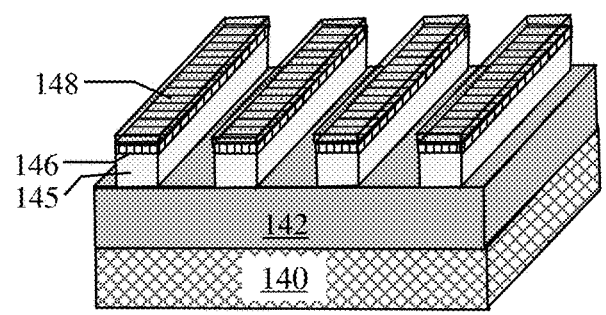
Figure 3C:
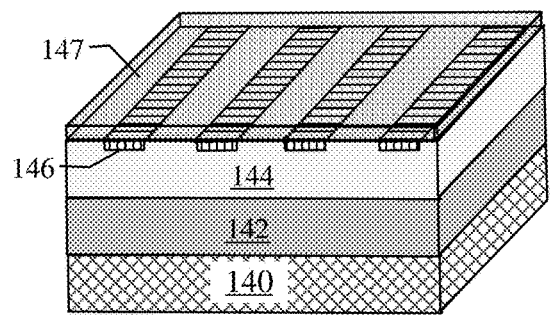

In block 124 of FIG. 2 and FIG. 3C, a masking precursor material solution can be spin-coated on the surface of the exposed photoresist layer 144 to form masking precursor material layer 147. The masking precursor material solution can be spin coated using masking chemical coat track 108 (FIG. 1). The masking precursor material can be inorganic or otherwise different from the photoresist.

In block 126 of FIG. 2 and FIG. 3D, masking chemicals in the masking precursor material layer 147 may react with the reactive groups in the chemically reactive surface pattern 146 to become a photoresist surface mask pattern 148. The masking precursor material layer 147 can comprise masking precursor chemicals that react with the chemically reactive surface pattern 146 to form a hardmask with a different etch resistivity/selectivity to unexposed photoresist. Example masking materials include silicon nitride, silicon oxide, and other dielectrics or metal-containing materials such as titanium nitride, tantalum nitride, titanium tungsten having a different etch selectivity compared to photoresist. Many masking materials have a significantly higher etch selectivity compared to photoresist, which means that a relatively thin photoresist surface mask pattern 148 (about 5 nm to 150 nm) may be sufficient for an etch mask. The chemical reaction between the masking precursor chemicals and the reactive groups may occur at room temperature or may occur at an elevated temperature in the bake chamber 104 (FIG. 1).

In block 128 of FIG. 2 and FIG. 3D, unreacted masking chemicals in masking precursor material layer 147 may be removed. The unreacted masking chemicals may be removed using the developer portion of the photoresist coat/develop track 102 (FIG. 1), using a wet clean chamber 110, or using a spin/rinse/dry chamber in the patterning system 100 in FIG. 1.

In block 130 of FIG. 2 and FIG. 3E, an anisotropic dry etch step may be performed to etch through the entire thickness of the photoresist layer 144 using the photoresist surface mask pattern 148 as a first etch mask forming photoresist mask pattern 145. This anisotropic etch step can be executed in conventional plasma-based etchers such as the photoresist etching chamber 112 in the patterning system 100 in FIG. 1.

Figure 3F:
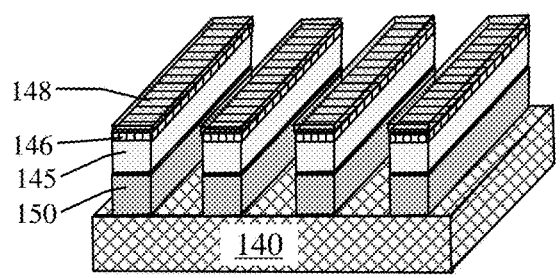

The photoresist mask pattern 145 may be used as a second etch mask to etch the pattern into the underlying layer to be etched 142 as is described in block 132 of FIG. 2 and FIG. 3F. Patterned geometries 150 are formed in the layer to be etched 142. This etching may be performed in plasma etching chamber 114 in patterning system 100 in FIG. 1. Alternatively, the pattern can be reversed to form an inverse relief pattern by filling the openings in the photoresist mask pattern 145 with a fill material, planarizing, then removing the photoresist mask pattern 145. Double patterning techniques can also be executed.

Figure 3G:
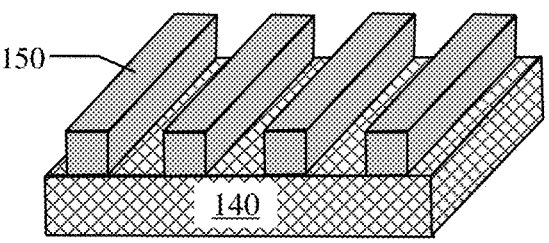

In block 134 in FIG. 2 and FIG. 3G, the photoresist mask pattern 145 may be removed in a plasma ashing chamber 116 (FIG. 1) leaving patterned geometries 150 on the substrate 140.

In some embodiments the layer to be etched 142 may be hardmask material having a different etch selectivity to an underlying material to be etched. In these embodiments, the photoresist surface mask pattern 148/photoresist mask pattern 145 may be a first etch mask to etch the pattern forming patterned geometries 150 in the hardmask material. The photoresist surface mask pattern 148/photoresist mask pattern 145 may then be removed by ashing in plasma ash chamber 116 (FIG. 1). Patterned geometries 150 may be used as a second etch mask to etch the pattern into an underlying layer or layers on the substrate 140.

Conventional EUV photo resists in which the entire thickness of the photoresist layer is exposed in an EUV scanner are engineered to be highly sensitive. Portions of the EUV photoresist exposed with EUV radiation become either soluble or insoluble in liquid or gaseous developers depending upon whether the EUV photoresist negative or positive tone. In addition, the typical EUV photoresists have to be engineered so that the developed EUV photoresist geometries (especially high aspect ratio geometries with a width 40 nm or less) have good structural integrity against pattern distortion and pattern collapse. To simultaneously meet these stringent criteria, conventional EUV photoresists are typically very expensive.

Figure 4:
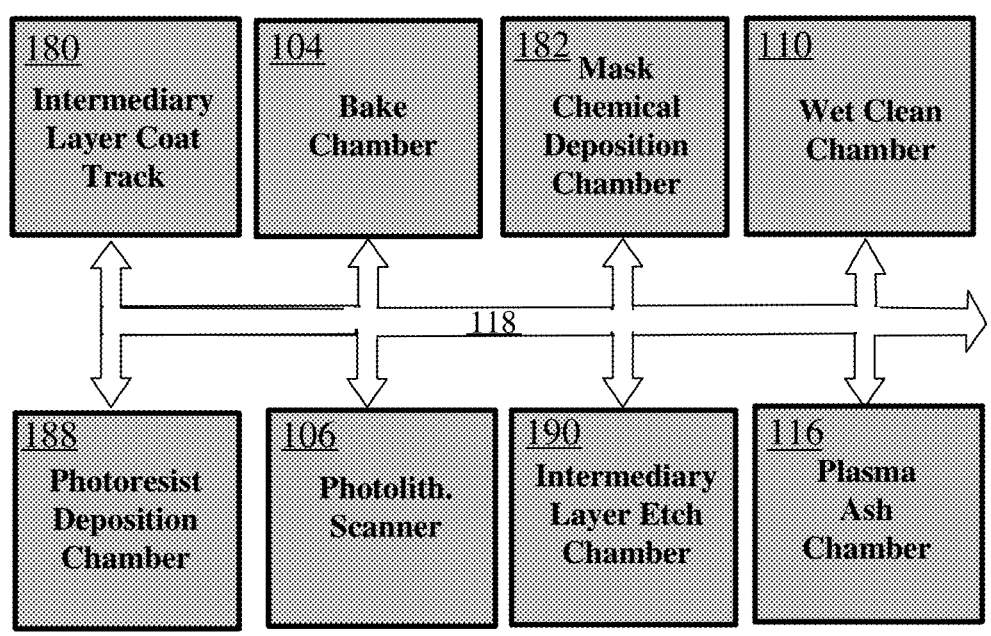
FIG. 4 is a block diagram of a semiconductor apparatus for forming patterns on substrates in accordance with embodiments.
Figure 5:
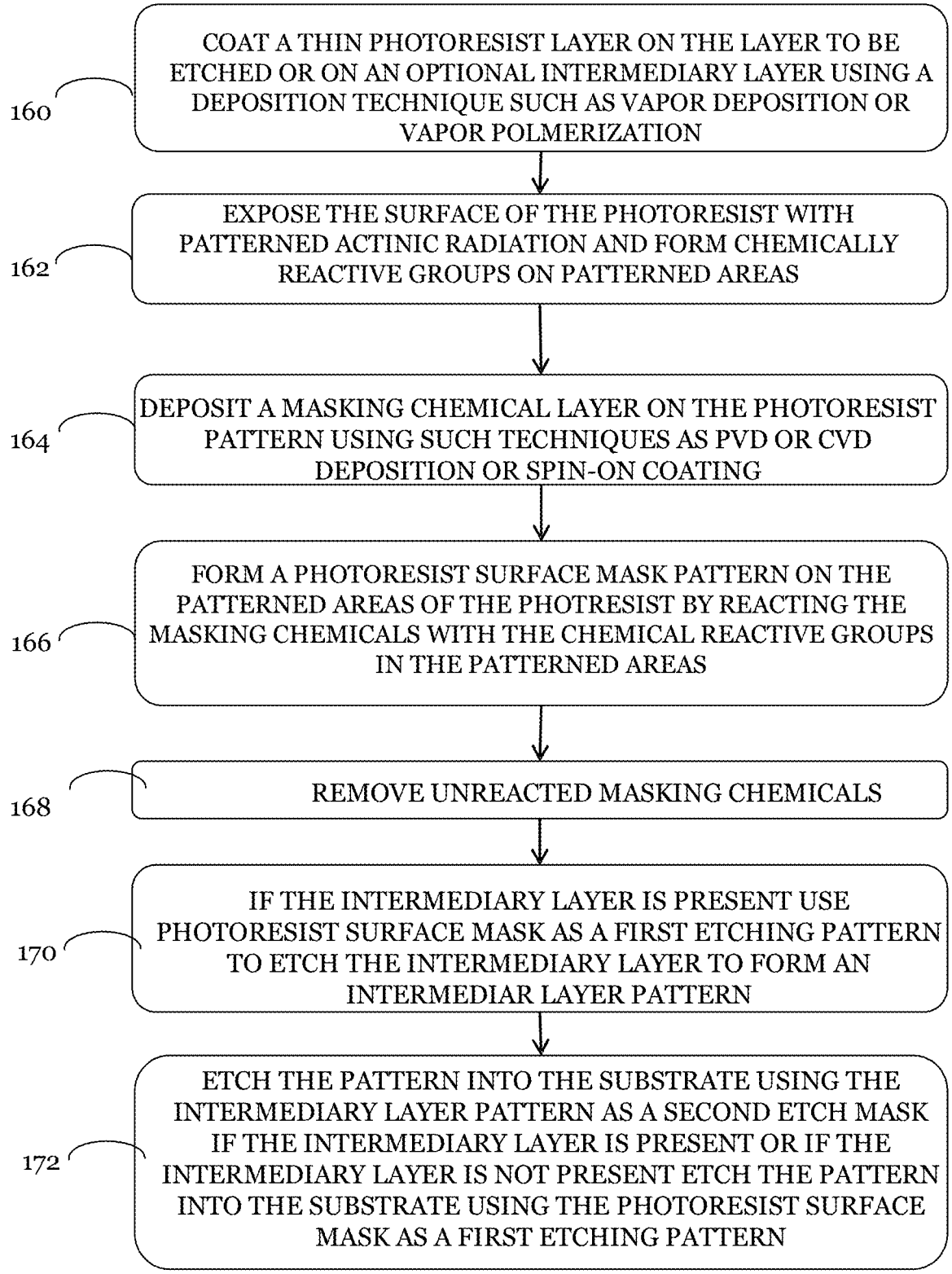
FIG. 5 is a flow diagram with blocks describing a patterning method using secondary resist surface functionalization for mask formation in accordance with embodiments.

Embodiments describing formation of thin photoresist surface etch masks will now be described with reference to FIG. 4, FIG. 5, FIGS. 6A-6G, and FIGS. 7A-7H. FIG. 4 is a block diagram describing a patterning system 115 for forming thin photoresist surface etch mask patterns on substrates such as semiconductor wafers. FIG. 5 is a flow diagram with blocks describing the major steps for forming thin photoresist surface etch mask patterns according to embodiments. FIGS. 6A-6G are three-dimensional isometric projection views illustrating process steps in the FIG. 5 flow diagram with the optional intermediary layer 200 omitted. FIGS. 7A-7H are three-dimensional isometric projection views illustrating process steps in the FIG. 5 flow diagram with the optional intermediary layer included.

The secondary resist surface functionalization patterning method forms chemically reactive groups only on surfaces where the EUV photoresist is exposed. A photoresist surface mask pattern is then formed on these exposed regions. For some applications a thick photoresist layer may be required to compensate for resist erosion during etching or to enable the etching of high aspect ratio trenches with vertical sidewalls. If a thick layer of EUV photoresist is used, the expensive photoactive polymers below the surface and throughout the photoresist layer 144 remain unexposed and unreacted. These expensive photoactive polymers are etched away in regions that were not protected by the photoresist surface mask pattern 148. If the photoresist surface etch mask 148 has sufficiently high etch selectivity to the underlying layer to be etched 142, a photoresist thickness of 50 nm or less may be sufficient. EUV photoresist may be spin-on deposited with thicknesses of 100 nm or less. EUV photoresist may be spin-on deposited with a thickness of 30 nm and maybe even thinner in the future. Thin layers of photo active polymers in the range of about 5 nm to 150 nm may be deposited using photoresist vapor deposition or photoresist vapor polymerization equipment and techniques.

If a thick pattern is required to compensate for losses during etch or to enable the etching of high aspect ratio trenches, a thin (5 nm to 150 nm) layer of expensive EUV photoresist may be deposited on top of a thick (1,000 nm to 5,000 nm or more) intermediary layer 200 of inexpensive, non-photoactive polymer. The non-photoactive polymer can be engineered with much more flexibility than the expensive EUV photoresist polymer to improve structural integrity of the pattern and to reduce cost. High aspect ratio geometries in the non-photoactive polymer layer, e.g., in the optional intermediary layer 200 can be engineered to have good structural integrity to prevent distortion of high aspect ratio patterns but do needing to be photo active nor transparent to EUV may be significantly less expensive.

Alternatively, the intermediary layer 200 may comprise a hardmask material such as silicon nitride, silicon oxide, and other dielectric materials or metal-containing materials such as titanium nitride, tantalum nitride, and titanium tungsten having a different etch selectivity to the underlying material to be etched.

The block diagram of a patterning system 115 in FIG. 4 shows various manufacturing tools coupled together with a wafer transport system 118. Some of the tools may be integrated into a track or may be standalone tools coupled to the track by the wafer transport system 118. The patterning system 115 in FIG. 4 includes an intermediary layer track for spin-coating intermediary layers, a bake chamber 104 for driving off solvents from spin-coated layers or for initiating thermally activated chemical reaction, a photoresist deposition chamber 188 for depositing thin layers of photoresist, a photolithography scanner for exposing the photoresist with patterns of actinic radiation, a masking chemical deposition chamber 182, an intermediary layer etching chamber 190, a wet clean chamber 110 for removing unreacted masking chemicals, and a plasma ash chamber 116 for removing organic layers such as photoresist. The photoresist deposition chamber 188 may be a spin-on photoresist track, a photoresist vapor deposition chamber or a photoresist vapor polymerization chamber. Bake chamber 104 can be a standalone bake chamber or can be a hot plate integrated into the intermediary layer coat track 180. The photolithography scanner 106 can be a scanner such as a deep ultraviolet scanner (DUV) with 248 nm or 193 nm radiation, extreme ultraviolet scanner (EUV) with 13.5 nm radiation, or an e-beam radiation scanner.

Figure 6A:
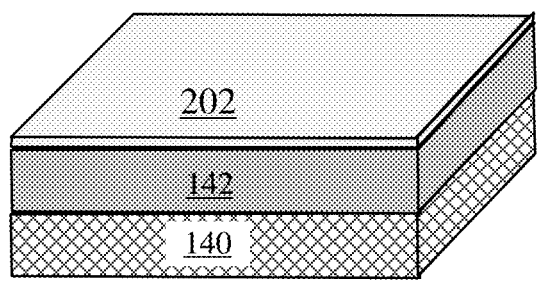
FIGS. 6A-6G are three-dimensional isometric projection views of process steps for forming patterns on substrates in accordance with embodiments.
Figure 7A:
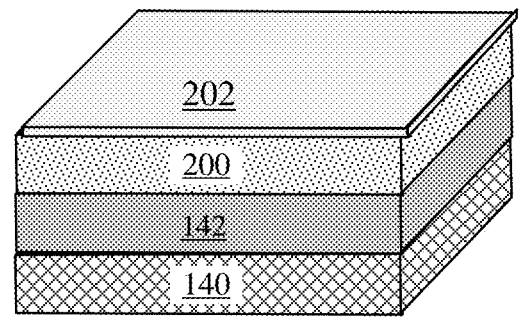
FIGS. 7A-7H are three-dimensional isometric projection views of process steps for forming patterns on substrates in accordance with embodiments.

Referring to block 160 in FIG. 5 and FIG. 7A, an optional intermediary layer 200 may be deposited on a layer to be etched 142 overlying a semiconductor substrate 140. FIG. 6A illustrates an embodiment where the thin photoresist surface etch mask 210 (FIG. 6F) has sufficient selectivity to the layer to be etched 142 that the intermediary layer 200 may be omitted. When the intermediary layer 200 is a polymer layer, it may be spin-coated onto the layer to be etched 142 in intermediary layer coat track 180 in the patterning system 115 FIG. 4. The intermediary layer 200 may be a polymer engineered to have structural integrity for high aspect ratio patterned geometries and engineered to have selectivity to an overlying thin photoresist surface etch mask 210 (FIG. 8E). Alternatively, the intermediary layer 200 may be comprised of a hard mask material such as a dielectric or metal deposited using a CVD or PVD technique.

Figure 6B:
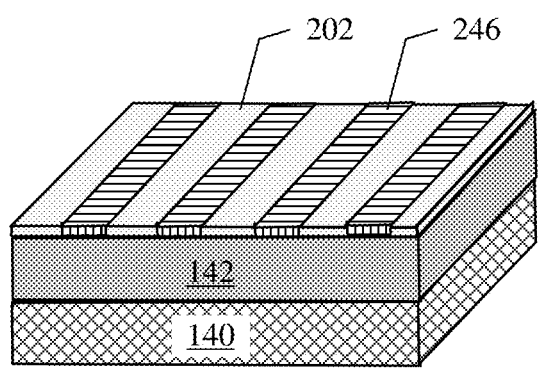
Figure 7B:
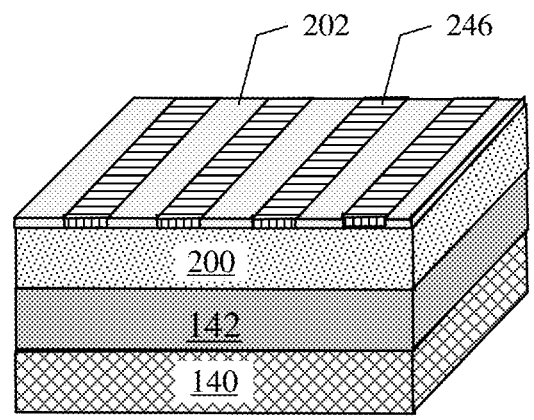

In block 160 in FIG. 5, along with FIG. 6A and FIG. 7A, a thin photoresist layer 202, may be deposited on the layer to be etched (FIG. 6B) or on an optional intermediary layer 200 (FIG. 7B). The thin photoresist layer 202 can be deposited in a photoresist deposition chamber 188 in the patterning system 115 in FIG. 4. The thin (about 5 nm to 150 nm) photoresist thin film can be deposited using techniques such as spin-on, deposition in a photoresist vapor deposition chamber or by in situ polymerization in a photoresist vapor polymerization chamber.

In block 162 in FIG. 5, and FIG. 6B and FIG. 7B, the thin photoresist layer 202 may be exposed with actinic radiation projected through a photomask to form patterned areas 246 with chemically active groups on the thin photoresist layer 202. Because the thickness of the thin photoresist layer 202 may be less than a conventional photoresist layer, the dose of actinic radiation needed to fully expose through the thickness of the thin photoresist layer 202 may also be correspondingly reduced. This can save significant time during scanning allowing the scanner to improve throughput.

Figure 6C:
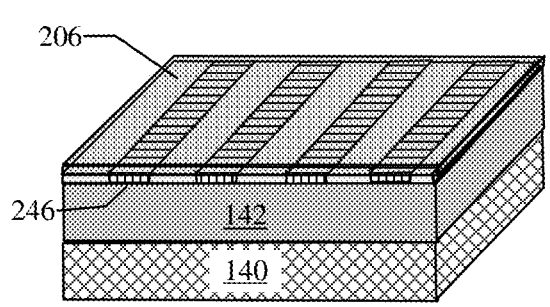
Figure 7C:
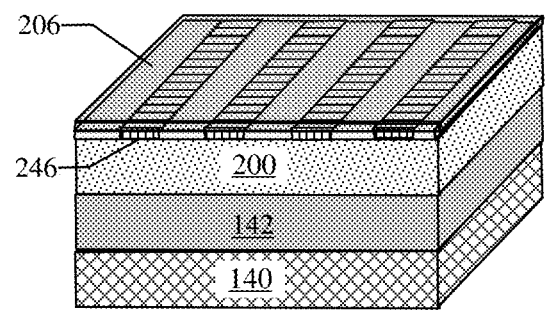

In block 164 in FIG. 5, and FIG. 6C and FIG. 7C, a layer 206 containing masking chemicals that react with the chemically active groups in the patterned areas 246 may be deposited using such techniques as PVD and CVD on the thin photoresist layer 202. Alternatively, the masking chemical layer 206 may be deposited by spin coating as described in previous embodiments.

Figure 6D:
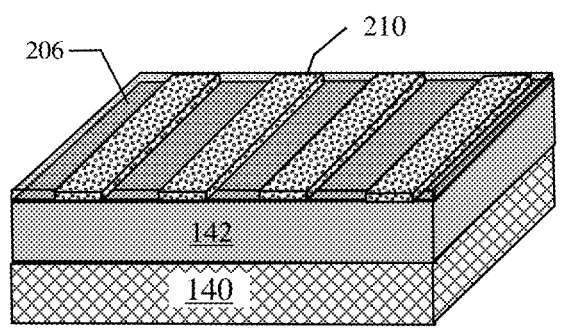
Figure 7D:
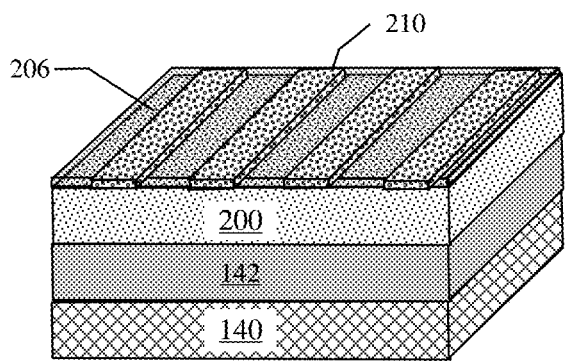

In block 166 in FIG. 5, and FIG. 6D and FIG. 7D, the masking chemicals may be reacted with the chemically active groups in patterned areas 246 on the surface of the thin photoresist layer 202 to form a photoresist surface etch mask 210. The masking chemicals may react with the surface polarity of the chemically active groups electrostatically or may chemically react with the surface polarity to form covalent bonds. The reaction between the masking chemicals and the chemically active groups may occur at room temperature or may be thermally activated in bake chamber 104 in the patterning system 115 in FIG. 4.

Figure 6E:
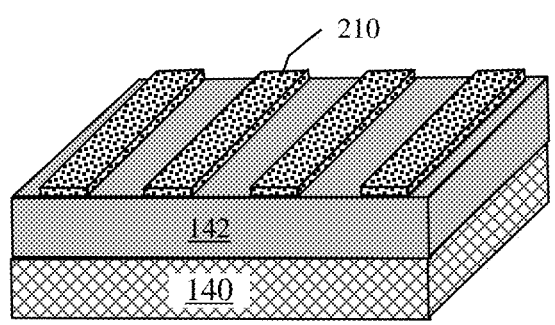
Figure 7E:
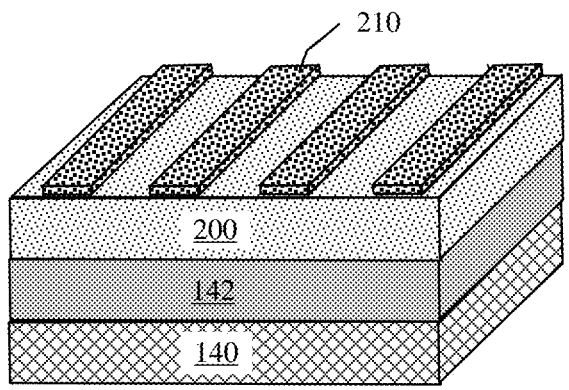

In block 168 in FIG. 5, along with FIG. 6E and FIG. 7E, unreacted masking chemicals may be removed. This operation may be performed in the develop section of a coat/develop track or in a wet clean chamber or in a spin-rinse-dry chamber. In some embodiments where masking chemicals such as gaseous organometallic masking chemicals react with the chemically active groups and selectively deposit the photoresist surface etch mask 210 only on the patterned areas 246, this step may not be needed.

Figure 7F:
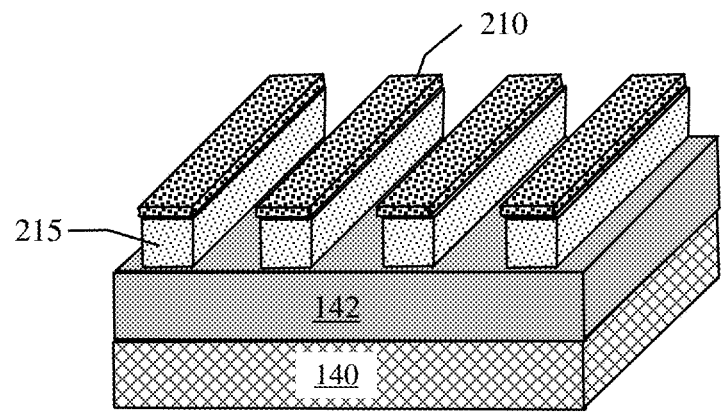

In block 170 in FIG. 5, along with FIG. 7F, the photoresist surface etch mask 210 is used as a first etch pattern to etch the pattern into the intermediary layer 200 to form an intermediary layer etch mask 215. This step is not performed in the embodiment described in FIGS. 6A-6G where photoresist surface etch mask 210 is formed directly on the layer to be etched 142 with no intermediary layer 200. This step may be performed in anisotropic plasma etch chamber (intermediary etch chamber 190) in the pattern system 115 in FIG. 4. The photoresist surface etch mask 210 may be removed after forming the intermediary layer etch mask 215.

Figure 7G:
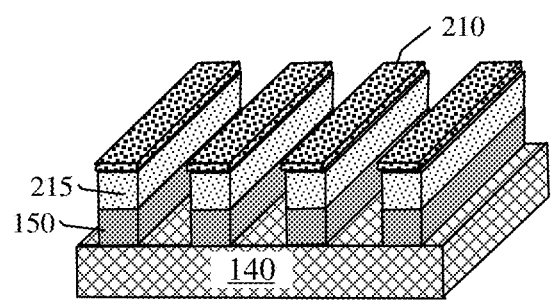

In block 172 in FIG. 5, and FIG. 7G, the intermediary layer etch mask 215 may be used as a second etch pattern to etch the pattern into the underlying layer to be etched 142 forming a pattern of etched geometries 250 on the substrate 140.

Figure 6F:
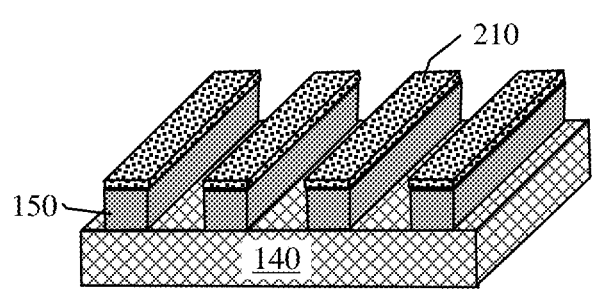

In block 172 in FIG. 5, and FIG. 6F, the photoresist surface etch mask 210 is used as a first etch pattern to etch the pattern into the layer to be etched 142 forming a pattern of etched geometries 250 on the substrate 140.

Figure 6G:
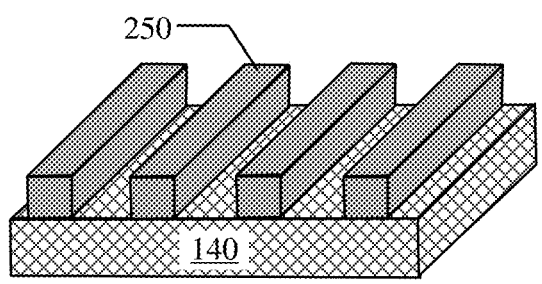
Figure 7H:
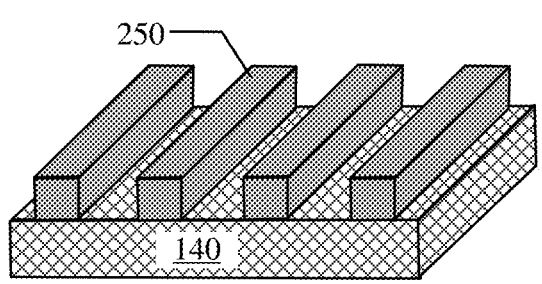

In block 174 in FIG. 5, along with FIG. 6G and FIG. 7H, the intermediary layer etch mask 215 (FIG. 7H) and the photoresist surface etch mask 210 (FIG. 6G and FIG. 7H) may be removed leaving the pattern of etched geometries 250 on the substrate 140. When the intermediary layer is polymeric, the plasma ash chamber 116 in patterning system 115 may be used to remove the intermediary layer etch mask 215.

As can be appreciated, many variations and modifications to the embodiments herein are contemplated. For example, instead of the exposed regions of the surface having a polarity change, the initial photoresist layer could have a desired surface energy, and then the pattern of actinic radiation change the surface energy such that selective deposition or selective modification happens on the unexposed regions. For selective deposition, many different available materials can be used. For selective modification, various treatment techniques can be used, including surface treatment with additional chemicals as well as baking, laser annealing, silylation, cross-linking, et cetera.

Example embodiments of the invention are summarized here. Other embodiments can also be understood from the entirety of the specification as well as the claims filed herein.

Example 1. A method of patterning a substrate includes receiving, at a track system, a substrate including a photoresist layer over a layer to be etched, the photoresist layer being sensitive to actinic radiation; exposing the photoresist layer with a pattern of the actinic radiation to form a chemically reactive surface pattern on portions of the photoresist layer exposed to the actinic radiation, deeper portions of the photoresist layer between the chemically reactive surface pattern and the layer to be etched remaining unexposed to the actinic radiation after the exposing; coating, at the track system, a spin-on-material to convert the chemically reactive surface pattern to a photoresist surface mask pattern, the chemically reactive surface pattern interacting with a masking chemical during the converting; removing, at the track system, portions of the spin-on-material that are not converted to the photoresist surface mask pattern; etching the photoresist layer using the photoresist surface mask pattern as a first etch mask to form a photoresist mask pattern; and etching the layer to be etched with the photoresist mask pattern as a second etch mask.

Example 2. The method of example 1, where the actinic radiation is UV, DUV, EUV, or e-beam radiation.

Example 3. The method of one of examples 1 or 2, where the photoresist layer is a chemically amplified photoresist and where exposing the photoresist layer causes a photo chemical reaction that forms carboxyl groups or hydroxyl groups, the carboxyl groups or hydroxyl groups changing a polarity of a major surface of the photoresist layer and forming the chemically reactive surface pattern.

Example 4. The method of one of examples 1 to 3, where chemically reactive groups on the chemically reactive surface pattern include acetyl groups, sulfonate groups, ether groups, hydroxyl groups, ester groups, aldehyde groups, carboxyl groups, amine groups, or amide groups.

Example 5. The method of one of examples 1 to 4, where the photoresist mask pattern includes silicon dioxide, silicon nitride, titanium, titanium oxide, titanium nitride, or aluminum oxide.

Example 6. The method of one of examples 1 to 5, where coating, at the track system, the spin-on-material includes spin coating the substrate with a mask precursor solution including the masking chemical to form a masking precursor material layer, the masking precursor material layer interacting with the chemically reactive surface pattern to form the photoresist surface mask pattern.

Example 7. A method of patterning a substrate includes receiving a substrate including a photoresist layer spin coated over a layer to be etched, a major surface of the photoresist layer including a chemically reactive surface pattern on first portions of the photoresist layer exposed to extreme ultraviolet radiation, second portions of the photoresist layer, disposed between the chemically reactive surface pattern and the layer to be etched, being unexposed to the extreme ultraviolet radiation; spin coating a mask precursor solution including a masking chemical and a solvent over the photoresist layer to form a mask precursor solution layer; forming, based on a chemical reaction between the mask precursor solution layer and the chemically reactive surface pattern, a photoresist surface mask pattern; removing unreacted mask precursor solution; patterning the photoresist layer using the photoresist surface mask pattern as a first etch mask to form a patterned photoresist layer; and etching the layer to be etched with the patterned photoresist layer as a second etch mask.

Example 8. The method of example 7, where the photoresist layer is a chemically amplified photoresist and where the first portions of the photoresist layer exposed to the extreme ultraviolet radiation include a different polarity than the second portions of the photoresist layer unexposed to the extreme ultraviolet radiation.

Example 9. The method of one of examples 7 or 8, where chemically reactive groups on the chemically reactive surface pattern include acetyl groups, sulfonate groups, ether groups, hydroxyl groups, ester groups, aldehyde groups, carboxyl groups, amine groups, and amide groups.

Example 10. The method of one of examples 7 to 9, where the spin coating, forming the photoresist surface mask pattern, removing the unreacted mask precursor solution, patterning the photoresist layer is performed in a track system.

Example 11. A method of patterning a substrate includes receiving a substrate including a photoresist layer disposed over a layer to be etched and an intermediary layer disposed between the photoresist layer and the layer to be etched; exposing the photoresist layer with a pattern of the actinic radiation to form a chemically reactive surface pattern on portions of the photoresist layer exposed to the actinic radiation; converting the chemically reactive surface pattern to form a photoresist surface mask pattern; etching the intermediary layer using the photoresist surface mask pattern as a first etch mask to form an intermediary layer pattern; and etching the layer to be etched with the intermediary layer pattern as a second etch mask.

Example 12. The method of example 11, where the photoresist layer is at the track system, spin coated onto the intermediary layer, and the photoresist layer further includes a chemically reactive surface pattern on first portions of the photoresist layer exposed to actinic radiation, and second portions of the photoresist layer disposed between the first portions and the layer to be etched, being unexposed to the actinic radiation.

Example 13. The method of one of examples 11 or 12, where the photoresist layer is deposited in a vapor deposition chamber in the track system or a vapor polymerization chamber in the track system and where a thickness of the photoresist layer is in the range of about 5 nm to 150 nm.

Example 14. The method of one of examples 11 to 13, where the photoresist layer includes a chemically amplified photoresist and where the first portions of the photoresist layer exposed to the actinic radiation include a different polarity than the second portions of the photoresist layer unexposed to the actinic radiation.

Example 15. The method of one of examples 11 to 14, where chemically reactive groups on the chemically reactive surface pattern include acetyl groups, sulfonate groups, ether groups, hydroxyl groups, ester groups, aldehyde groups, carboxyl groups, amine groups, or amide groups.

Example 16. The method of one of examples 11 to 15, where the photoresist surface mask pattern includes silicon dioxide, silicon nitride, titanium, titanium dioxide, titanium nitride, or aluminum oxide.

Example 17. The method of one of examples 11 to 16, the method further including spin coating, at the track system, the intermediary layer.

Example 18. The method of one of examples 11 to 17, where converting the chemically reactive surface pattern includes reacting, in a vapor reaction chamber in the track system, the chemically reactive surface pattern with gas molecules including: silicon and halogen atoms; gas molecules including silicon, hydrogen, and halogen atoms; gas molecules including silicon, oxygen, and hydrogen atoms; gas molecules including silicon, hydrogen, oxygen, and halogen atoms; or gas molecules including organometallic gas molecules.

Example 19. The method of one of examples 11 to 18, where the converting includes in a vapor deposition chamber in the track system, executing a vapor deposition process to selectively deposit a masking precursor material over a major surface of the chemically reactive surface pattern and reacting the masking precursor material with the chemically reactive surface pattern to form the photoresist surface mask pattern.

Example 20. The method of one of examples 11 to 19, where executing a vapor deposition process includes performing a thermal deposition process, a chemical vapor deposition process, an atomic layer deposition process, or a plasma assisted chemical vapor deposition process.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "target substrate" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

What is claimed is:

1. A method of patterning a substrate, the method comprising:
   receiving, at a track system, a substrate comprising a photoresist layer over a layer to be etched, the photoresist layer being sensitive to actinic radiation;
   exposing the photoresist layer with a pattern of the actinic radiation to form a chemically reactive surface pattern on portions of the photoresist layer exposed to the actinic radiation and leaving unexposed portions of the photoresist layer, deeper portions of the photoresist layer between the chemically reactive surface pattern and the layer to be etched also being unexposed to the actinic radiation after the exposing;

while retaining the unexposed portions of the photoresist layer, coating, at the track system, a masking precursor material layer over the exposed and unexposed portions of the photoresist layer, the masking precursor material layer comprising a masking chemical that converts the chemically reactive surface pattern to a photoresist surface mask pattern;

removing, at the track system, portions of the masking precursor material layer that are not converted to the photoresist surface mask pattern;

etching the photoresist layer using the photoresist surface mask pattern as a first etch mask to form a photoresist mask pattern; and etching the layer to be etched with the photoresist mask pattern as a second etch mask.

2. The method of claim 1, wherein the actinic radiation is UV, DUV, EUV, or e-beam radiation.

3. The method of claim 1, wherein the photoresist layer is a chemically amplified photoresist and wherein exposing the photoresist layer causes a photo chemical reaction that forms carboxyl groups or hydroxyl groups, the carboxyl groups or hydroxyl groups changing a polarity of a surface of the photoresist layer and forming the chemically reactive surface pattern.

4. The method of claim 1, wherein chemically reactive groups on the chemically reactive surface pattern comprise acetyl groups, sulfonate groups, ether groups, hydroxyl groups, ester groups, aldehyde groups, carboxyl groups, amine groups, or amide groups.

5. The method of claim 1, wherein the photoresist mask pattern comprises silicon dioxide, silicon nitride, titanium, titanium oxide, titanium nitride, or aluminum oxide.

6. The method of claim 1, wherein coating, at the track system, the masking precursor material layer comprises spin coating the substrate with a mask precursor solution comprising the masking chemical to form the masking precursor material layer.

7. The method of claim 1, wherein the layer to be etched comprises silicon nitride, silicon dioxide, titanium nitride, tantalum nitride, or titanium tungsten.

8. The method of claim 7, further comprising:
ashing, at the track system, the photoresist surface mask pattern and the photoresist mask pattern.

9. A method of patterning a substrate, the method comprising:

receiving a substrate comprising a photoresist layer spin coated over a layer to be etched, a surface of the photoresist layer comprising a chemically reactive surface pattern on first portions of the photoresist layer exposed to extreme ultraviolet radiation, unexposed portions of the photoresist layer comprising second portions at the surface and deeper portions disposed between the chemically reactive surface pattern and the layer to be etched;

while retaining the unexposed portions of the photoresist layer, spin coating a mask precursor solution to form a mask precursor solution layer over the first portions and the unexposed portions of the photoresist layer, the mask precursor solution comprising a masking chemical and a solvent;

forming, based on a chemical reaction between the mask precursor solution layer and the chemically reactive surface pattern, a photoresist surface mask pattern;

removing unreacted mask precursor solution;

patterning the photoresist layer using the photoresist surface mask pattern as a first etch mask to form a patterned photoresist layer; and etching the layer to be etched with the patterned photoresist layer as a second etch mask.

10. The method of claim 9, wherein the photoresist layer is a chemically amplified photoresist and wherein the first portions of the photoresist layer exposed to the extreme ultraviolet radiation comprise a different polarity than the second portions of the photoresist layer unexposed to the extreme ultraviolet radiation.

11. The method of claim 9, wherein chemically reactive groups on the chemically reactive surface pattern comprise acetyl groups, sulfonate groups, ether groups, hydroxyl groups, ester groups, aldehyde groups, carboxyl groups, amine groups, and amide groups.

12. The method of claim 9, wherein the spin coating, forming the photoresist surface mask pattern, removing the unreacted mask precursor solution, and patterning the photoresist layer are performed in a track system.

13. The method of claim 9, wherein the patterned photoresist layer comprises silicon dioxide, silicon nitride, titanium, titanium oxide, titanium nitride, or aluminum oxide.

14. The method of claim 9, wherein the layer to be etched comprises silicon nitride, silicon dioxide, titanium nitride, tantalum nitride, or titanium tungsten.

15. A method of patterning a substrate, the method comprising:

receiving a substrate comprising a photoresist layer disposed over a hard mask, the photoresist layer being sensitive to actinic radiation, the hard mask comprising silicon nitride, silicon dioxide, titanium nitride, tantalum nitride, or titanium tungsten;

exposing the photoresist layer with patterned actinic radiation to form a chemically reactive surface pattern on first portions of the photoresist layer exposed to the actinic radiation, unexposed portions of the photoresist layer comprising second portions at the surface and deeper portions disposed between the chemically reactive surface pattern and the hard mask;

while retaining the unexposed portions of the photoresist layer, coating a masking precursor material layer over the first portions and the unexposed portions of the photoresist layer, the masking precursor material layer comprising a masking chemical that converts the chemically reactive surface pattern to a photoresist surface mask pattern;

removing portions of the masking precursor material layer that are not converted to the photoresist surface mask pattern;

etching the photoresist layer using the photoresist surface mask pattern as a first etch mask to form a photoresist mask pattern;

etching the hard mask with the photoresist mask pattern as a second etch mask; and ashing the photoresist surface mask pattern and the photoresist mask pattern.

16. The method of claim 15, wherein the actinic radiation is UV, DUV, EUV, or e-beam radiation.

17. The method of claim 15, wherein the photoresist layer is a chemically amplified photoresist and wherein exposing the photoresist layer causes a photochemical reaction that forms carboxyl groups or hydroxyl groups, the carboxyl groups or hydroxyl groups changing a polarity of a surface of the photoresist layer and forming the chemically reactive surface pattern.

18. The method of claim 15, wherein chemically reactive groups on the chemically reactive surface pattern comprise acetyl groups, sulfonate groups, ether groups, hydroxyl groups, ester groups, aldehyde groups, carboxyl groups, amine groups, or amide groups.

19. The method of claim 15, wherein the photoresist mask pattern comprises silicon dioxide, silicon nitride, titanium, titanium oxide, titanium nitride, or aluminum oxide.

20. The method of claim 15, wherein the coating, forming the photoresist surface mask pattern, removing portions of the masking precursor material layer, etching the photoresist layer, and ashing are performed in a track system.

* * * * *